United States Patent
Tang et al.

(10) Patent No.: US 8,162,685 B2
(45) Date of Patent: Apr. 24, 2012

(54) SOCKET CONNECTOR HAVING A LOCKING MEMBER TO RESTRICT UPWARD AND DOWNWARD MOVEMENT OF A FASTENED PORTION OF A LOAD LEVER

(75) Inventors: Kun Tang, Shenzhen (CN); Fu-Jin Peng, Shenzhen (CN)

(73) Assignee: Hon Hai Precision Ind. Co., Ltd., New Taipei (TW)

( * ) Notice: Subject to any disclaimer, the term of this patent is extended or adjusted under 35 U.S.C. 154(b) by 0 days.

(21) Appl. No.: 13/031,254

(22) Filed: Feb. 21, 2011

(65) Prior Publication Data
US 2011/0230063 A1    Sep. 22, 2011

(30) Foreign Application Priority Data
Mar. 16, 2010   (CN) .......................... 2010 2 0131393

(51) Int. Cl.
*H01R 13/62* (2006.01)
(52) U.S. Cl. ...................................... 439/331
(58) Field of Classification Search .................. 439/331, 439/330, 332, 326, 157, 342, 73
See application file for complete search history.

(56) References Cited

U.S. PATENT DOCUMENTS

| | | | |
|---|---|---|---|
| 6,957,973 B1 | 10/2005 | McHugh et al. | |
| 7,033,198 B2 | 4/2006 | Chiang | |
| 7,435,124 B2 * | 10/2008 | Ma et al. | 439/331 |
| 7,438,580 B1 | 10/2008 | Aoki et al. | |
| 7,909,631 B2 * | 3/2011 | Ma | 439/331 |
| 8,052,451 B2 * | 11/2011 | Yeh | 439/331 |
| 2008/0081489 A1 * | 4/2008 | MacGregor et al. | 439/71 |

* cited by examiner

*Primary Examiner* — Chandrika Prasad
(74) *Attorney, Agent, or Firm* — Andrew C. Cheng; Wei Te Chung; Ming Chieh Chang

(57) ABSTRACT

A socket connector mounted on a mother board includes a socket body with a plurality of contacts received therein, a load plate rotatable with respect to the socket body and capable of being located in a closed position above the socket body, a load lever engaged with the load plate to lock the load plate in the closed position, and a locking member. The load lever has a fastened portion engaged with locking member. The locking member has a supporting portion below the fastened portion for preventing the load lever from touching the mother board and a latching portion above the fastened portion for preventing the load lever from upwardly escaping away from the locking member.

20 Claims, 4 Drawing Sheets

SOCKET CONNECTOR HAVING A LOCKING MEMBER TO RESTRICT UPWARD AND DOWNWARD MOVEMENT OF A FASTENED PORTION OF A LOAD LEVER

BACKGROUND OF THE INVENTION

1. Field of the Invention

The present invention relates to a socket connector, and more particularly to a socket connector having a loading mechanism with a lever supported by a load plate without in contacting with a motherboard during operation.

2. Description of Related Art

Connectors or sockets are widely used in the electronic transmitting field to interconnect two separate electronic components, i.e. an IC package and a motherboard, so as to establish electrical connection therebetween. The connector basically includes an insulative housing, a plurality of electrical contacts received in the insulative housing for contacting the leads or terminals of the IC package. Additional, the connector generally needs a loading device to lock the IC package in a closed position.

U.S. Pat. No. 7,033,198 issued to Chiang, on Apr. 25, 2006 discloses a socket connector which includes a socket body adapted to an IC package and a loading device for locking the IC package. The loading device includes a load plate for pressing the IC package and a load lever for locking the load plate. The load lever has an L-like shape with a transverse portion serving as a pivot and having a cam capable of locking a free end of the load plate. A longitudinal portion perpendicular to the transverse portion is also provided to be manually rotated. A free end of the longitudinal portion is likely to stab and damage an upper surface of the mother board as the free end is moved toward the mother board, especially when the user applies an excessively large force on the free end of the lever. Moreover, the load lever is commonly made of metal and thus has a robust intensity. Therefore the possibility of the damage to the mother board is further increased.

U.S. Pat. No. 6,957,973 issued to McHugh, on Oct. 25, 2005 discloses another socket having a similar structure in which a hook is provided on a corner of a retention frame to latch a load lever. The load lever is firstly deformed outwardly and moved downwardly to pass the hook, and is then pushed inwardly to be located under the hook and abut against the hook due to itself elastic force. However, when the load lever is pushed downward, it is also possible for it to contact the mother board on which the connector is seated, and therefore, the risk of damaging the mother board exists.

U.S. Pat. No. 7,438,580 issued to Aoki, on Oct. 21, 2008 also discloses a locking means for engaging with a load lever. Compared with McHugh, the hook is designed on a load plate and there is no retention frame employed in Aoki. However, the load lever is also likely to contact the mother board during the engagement with hook. So the risk of damaging the mother board still exists.

In view of the above, an improved socket connector is desired that is able to protect a mother board from damage.

SUMMARY OF THE INVENTION

Accordingly, an object of the present invention is to provide an socket connector having an improved loading device without damaging a mother board to which the socket connector is mounted.

According to one aspect of the present invention there is provided a socket connector mounted on a mother board and including a socket body with a plurality of contacts received therein, a load plate rotatable with respect to the socket body and capable of being located in a closed position above the socket body, a load lever engaged with the load plate to lock the load plate in the closed position, and a locking member. The load lever has a fastened portion engaged with locking member. The locking member has a supporting portion below the fastened portion for preventing the load lever from touching the mother board and a latching portion above the fastened portion for preventing the load lever from upwardly escaping away from the locking member.

Other objects, advantages and novel features of the invention will become more apparent from the following detailed description when taken in conjunction with the accompanying drawings, in which:

DETAILED DESCRIPTION OF THE INVENTION

Reference will now be made to the drawings to describe the present invention in detail.

Figure 1:
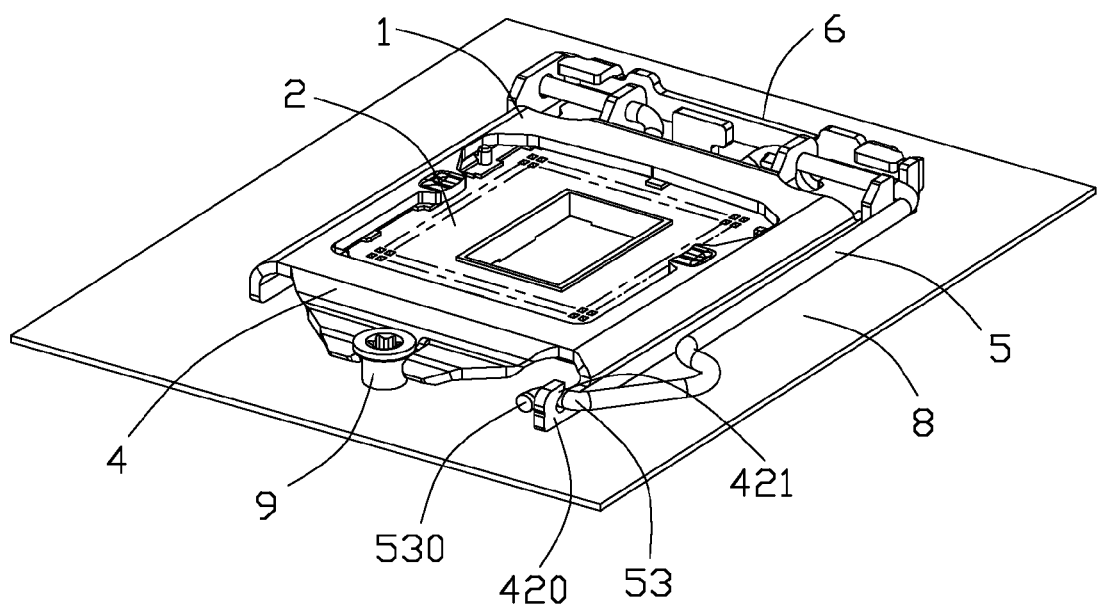
FIG. 1 is an assembled, perspective view of a socket connector in accordance with a preferred embodiment of the present invention and a mother board on which the socket connector is mounted.
Figure 2:
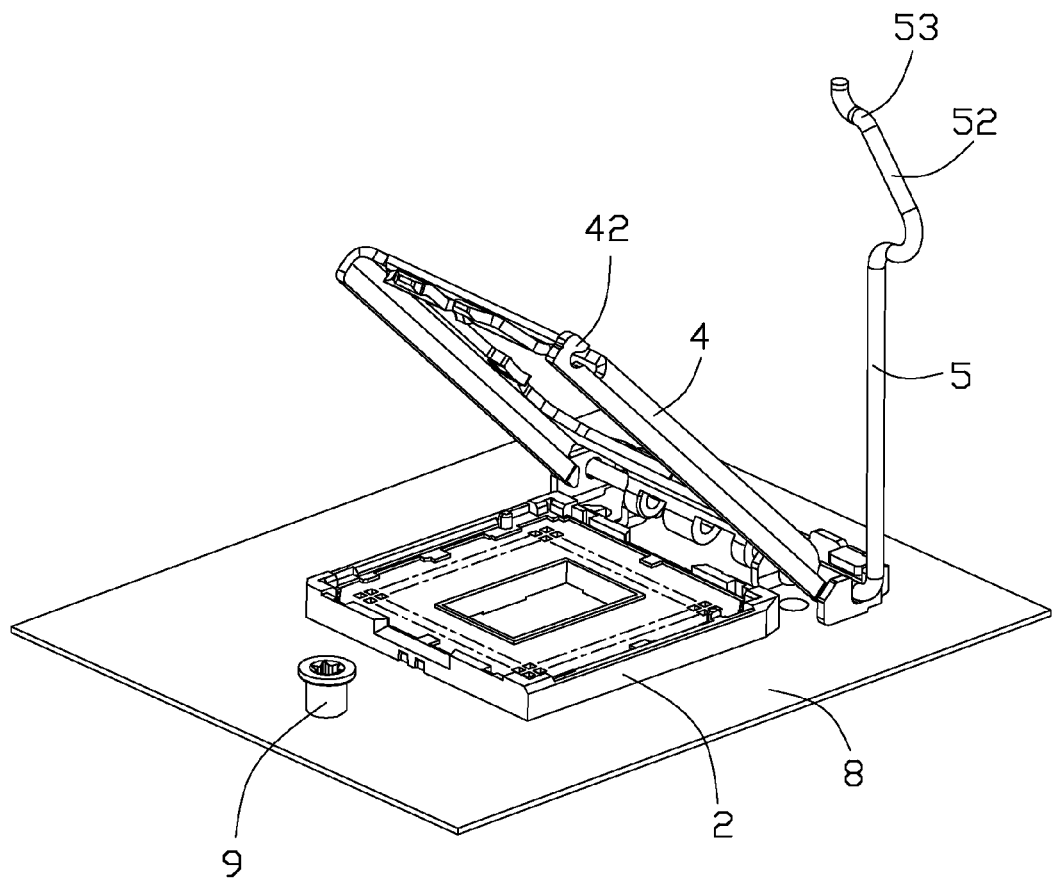
FIG. 2 is another perspective view of the socket connector as shown in the FIG. 1, wherein a load plate thereof is located in an angled position.
Figure 3:
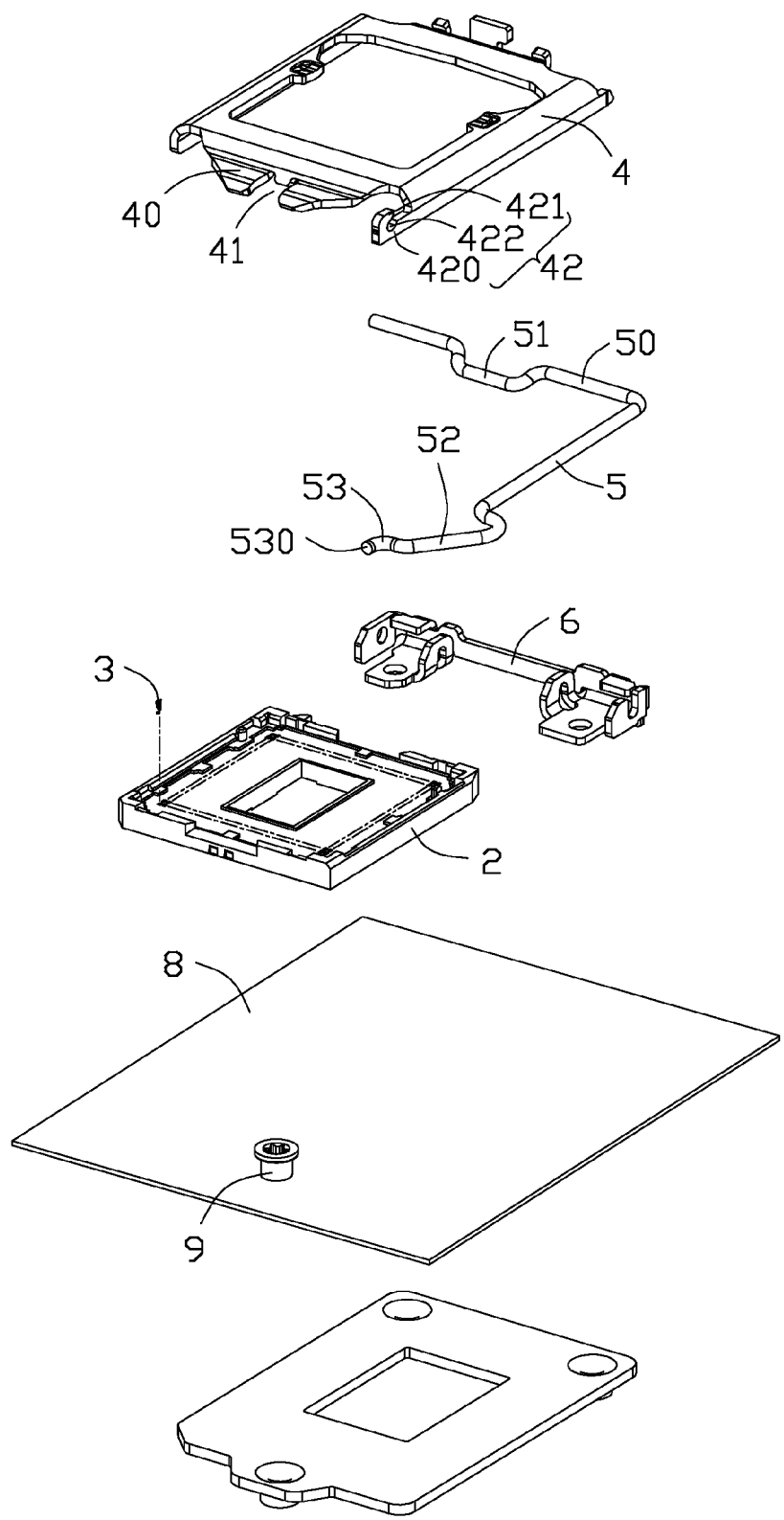
FIG. 3 is an exploded, perspective view of the socket connector and the mother board shown in FIG. 1 and FIG. 2.

Referring to FIG. 1 and FIG. 3, a socket connector 1 made in accordance with the present invention includes a socket body 2 with a plurality of contacts 3 received therein and a loading device cooperated with the socket body 2 to load an IC package (not shown) upon the socket body 2. The socket body 2 and the loading device are both mounted on a mother board 8.

Particularly referring to FIG. 3, the socket body 2 has a rectangular shape adapted to the IC package which is electrically communicate with the contacts 3 in the socket body 2. A retainer 6 is mounted on the mother board 8 beside one end of the socket body 2. The load lever 5 has an L-shape configuration and has a pivot 50 assembled to the retainer 6 and an operating rod (not labeled) perpendicular to the pivot 50. A cam 51 is formed at a middle position of the pivot 50 for engaging with the load plate 4. The load plate 4 has a first end assembled with the pivot 50 of the load lever 5 and a second end opposite to the first end. The load plate 4 is rotatable with respect to the socket body 2 and is capable of sliding above the socket body 2 due to the rotation of the load lever 5. The second end of the load plate 4 is formed with a tongue 40 having a notch 41 capable of engaging with a screw 9 which is also mounted on the mother board 8, so as to lock the second end of the load plate 4.

Figure 4:
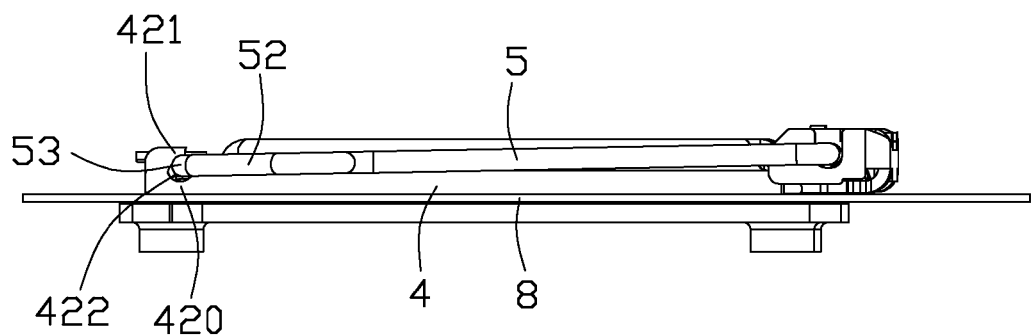
FIG. 4 is side view of the socket connector and the mother board shown in FIG. 1.

A slant operating portion 52 is formed by bending from the operation bar for manual operation of the load lever 5, and a fastened portion 53 extends from one end of the operation portion 52. Additionally, a blocking portion 530 at a free end of the load lever is formed by extending from the fastened portion. Also referring to FIG. 4, the loading plate 4 further has a pair of sidewalls (not labeled) interconnecting the first end and the second end. A locking member 42 is formed by integrally extending from one end of one sidewall of the load plate 4. The locking member 42 engages with the fastened portion 53 to lock the load lever 5 in closed position. The locking member 42 has a substantially U-shape configuration defining an opening (not labeled) facing toward the load lever 5. The locking member 42 includes a supporting portion 420 extending from the sidewall and located upon the mother board 8, a latching portion 421 above the supporting portion 420, and a receiving hole 422 between the supporting portion 420 and the latching portion 421. When the load lever 5 is locked by the locking member 42, the fastened portion 53 is received in the receiving hole 422.

Following is detailed description of the principle and method regarding how the load lever 5 is locked by the locking member 42. Firstly, the load lever 5 is rotated to have the fastened portion 53 move toward the locking member 42. Before the fastened portion 53 reaches a top end of the locking member 42, the operating portion 52 of the load lever 5 is pushed toward inside of the load plate 4 so as to make the operating rod deflect and offset relative to its original position along a lateral direction. The operating portion 52 is then pressed downward to be positioned in front of the opening of the U-shape locking member 42. The operating portion 52 moves outwardly to a predetermined position due to the elastic recovery as the lateral force applied on it is gradually released, and the fastened portion 53 finally gets into the receiving hole 422. The supporting portion 420 below prevents the fastened portion 53 from touching the mother board 8, and the latching portion 421 above prevents the fastened portion 53 from upwardly escaping away from the locking member 42. In addition, the blocking portion 530 of the load lever 5 is located at inner side of the locking member 42 and prevents the load lever 5 from outwardly escaping away from the locking member 42. When the load lever 5 is operated and locked into the closed position, the load plate 4 is driven by the load lever 5 to move along a horizontal direction upon the mother board 8, and has the notch 41 at the second end thereof engage with the screw 9 that is secured on the mother board 8. Meanwhile, the first end of the load plate is securely locked by the cam 51 of the load lever 5.

The releasing process of the load lever 5 is in reverse to the above-described locking process. Namely, the operating portion 52 is firstly pushed inwardly to allow the fastened portion 53 to be out of the receiving hole 422 of the locking member 42, and then the operating rod is lifted up so that the fastened portion 53 is finally released. The load plate 4 moves rearwardly to be out of the engagement with the screw 9 as the operating rod of load lever 5 rotates upwardly. The load plate 4 is subsequently able to rotate to an opened position.

Since the supporting portion 420 exists and is located below the fastened portion 53 of the load lever 5, there is not any possibility for any part, especially the free end of the load lever 5 to touch and damage an upper surface of the mother board, even in case of an excessively large force applied on the operating portion by a user.

While preferred embodiments in accordance with the present invention has been shown and described, equivalent modifications and changes known to persons skilled in the art according to the spirit of the present invention are considered within the scope of the present invention as defined in the appended claims.

What is claimed is:

1. A socket connector mounted on a mother board, comprising:
    a socket body with a plurality of contacts received therein;
    a load plate rotatable with respect to the socket body and capable of being located in a closed position above the socket body;
    a load lever engaged with the load plate to lock the load plate in the closed position, the load lever having a fastened portion; and
    a locking member engaged with the fastening portion of the load lever, the locking member having a supporting portion below the fastened portion for preventing the load lever from touching the mother board and a latching portion above the fastened portion for preventing the load lever from upwardly escaping away from the locking member.

2. The socket connector as claimed in claim 1, wherein the locking member has an U-shape configuration with an opening facing toward the load lever.

3. The socket connector as claimed in claim 1, wherein the load lever is formed with a blocking portion located at an inner side of the locking member so as to prevent the load lever from escaping away from the locking member along a lateral direction perpendicular to the vertical direction.

4. The socket connector as claimed in claim 1, wherein the load plate has a pair of sidewalls and the locking member extends integrally from one of the sidewalls.

5. The socket connector as claimed in claim 1, further comprising a retainer mounted on the mother board and assembled with the load lever.

6. The socket connector as claimed in claim 5, wherein the load plate has a first end pivotally assembled with the load lever and is capable of sliding above the socket body due to the rotation of the load lever.

7. The socket connector as claimed in claim 6, further comprising a screw secured on the mother board, and the load plate has a second end with a notch engaged with the screw so as to lock the second end of the load plate.

8. The socket connector as claimed in claim 1, wherein the load lever has a slant operating portion formed adjacent the fastened portion.

9. A loading device mounted on a mother board for cooperation with a socket, comprising:
    a load plate has opposing first end and a second end defining a transverse direction, and a pair of opposing sidewalls interconnecting the first and second ends and defining a longitude direction perpendicular to the transverse direction; and
    a load lever has a pivot engaged with the first end of the load plate and extending along said transversal direction, and a operating rod rotatable with respect to the load plate and extending along said longitude direction, the operating rod having a fastened portion; and
    a locking member having a receiving slot for receiving the fastened portion and constrain both upward movement and downward movement of the fastened portion along a vertical direction, and wherein
    when the load lever needs to be released from the locking member, a lateral movement of the operating rod is necessary to unlock the fastened portion first, before the operating rod is lifted up.

10. The loading device as claimed in claim 9, wherein said lateral movement of the operating rod is toward the load plate.

11. The loading device as claimed in claim 10, wherein the load lever is further formed with a blocking portion located adjacent an inner side of the locking member so as to prevent the load lever from outwardly escaping away from the locking member along said lateral direction.

12. The loading device as claimed in claim 9, further comprising a retainer mounted on the mother board and assembled with the load lever, and the first end of the load plate is also assembled with the load lever.

13. The loading device as claimed in claim 12, wherein the load plate is able to be moved above along a horizontal direction relative to the socket due to the rotation of the load lever.

14. The loading device as claimed in claim 13, further comprising a screw secured on the mother board, and the second end of the load plate has a notch engaged with the screw so as to lock the second end of the load plate.

15. The loading device as claimed in claim 9, wherein the load lever has a slant operating portion formed adjacent the fastened portion.

16. A socket connector assembly comprising:
a printed circuit board defining opposite first and second retention areas;
a socket body mounted upon the printed circuit board between said first and second retention areas, and including a plurality of contacts received therein;
a retainer mounted upon the first retention area;
a load plate defining opposite first and second ends thereof with the first end pivotally mounted upon the retainer;
a load lever defining a pivotal shaft located around the first retention area and defining first and second pivot axes offset from each other wherein the first pivot axis is pivotally mounted upon the retainer and the second pivot axis is pivotally mounted upon the load plate, said load lever further defining a handle unitarily extending from the pivotal shaft and moving in a vertical plane essentially perpendicular to said load plate; and
a locking head mounted upon the second retention area of the printed circuit board and adapted to be engaged with the second end of the load plate; wherein
the load plate defines a locking member forming a locking structure for a downwardly locking face thereof to lock the handle for preventing upward movement of the handle when the second end of the load plate is locked by the locking head, and further forming an upward supporting structure to upwardly confront the handle for preventing downward movement of the handle.

17. The socket connector assembly as claimed in claim 16, wherein the locking structure extends in a plane perpendicular to the printed circuit board.

18. The socket connector assembly as claimed in claim 16, wherein the supporting structure extends in a plane perpendicular to the printed circuit board.

19. The socket connector assembly as claimed in claim 16, wherein the locking structure and the supporting structure are parallel to each other.

20. The socket connector assembly as claimed in claim 16, wherein the locking structure and the supporting structure are essentially aligned with each other in a vertical direction.

* * * * *